US006174631B1

(12) United States Patent
French et al.

(10) Patent No.: US 6,174,631 B1
(45) Date of Patent: Jan. 16, 2001

(54) ATTENUATING PHASE SHIFT PHOTOMASKS

(75) Inventors: Roger Harquail French, Wilmington, DE (US); Kenneth George Sharp, Landenberg, PA (US)

(73) Assignee: E. I. du Pont de Nemours and Company, Wilmington, DE (US)

(*) Notice: Under 35 U.S.C. 154(b), the term of this patent shall be extended for 0 days.

(21) Appl. No.: 09/484,149

(22) Filed: Jan. 18, 2000

Related U.S. Application Data

(60) Division of application No. 09/294,575, filed on Apr. 20, 1999, now Pat. No. 6,096,460, which is a continuation-in-part of application No. 08/797,444, filed on Feb. 10, 1997, now abandoned.
(60) Provisional application No. 60/021,460, filed on Jul. 3, 1996.

(51) Int. Cl.[7] .................................................. G03F 9/00
(52) U.S. Cl. .................................................................. 430/5
(58) Field of Search ........................ 430/5, 322; 428/421, 428/429

(56) References Cited

U.S. PATENT DOCUMENTS

| | | | |
|---|---|---|---|
| 4,890,309 | 12/1989 | Smith et al. | 378/38 |
| 5,100,503 | 3/1992 | Allman et al. | 438/694 |
| 5,354,632 | 10/1994 | Dao et al. | 430/5 |
| 5,415,953 | 5/1995 | Alpay et al. | 430/5 |
| 5,459,002 | 10/1995 | Alpay et al. | 430/5 |
| 5,663,016 * | 9/1997 | Hong | 430/5 |
| 5,726,247 | 3/1998 | Michalczyk | 525/142 |

OTHER PUBLICATIONS

Lin, B.J., "The Attenuated Phase–Shifting Mask", Solid State Technology, pp. 43–47 (Jan. 1992).

* cited by examiner

Primary Examiner—S. Rosasco

(57) ABSTRACT

Transmissive attenuated embedded phase shifter photomasks comprising at least one polymeric material, preferably an amorphous fluoropolymer or an amorphous fluoropolymer doped with a fluorine functionalized organosilane, and organosilicates, or combinations thereof, the polymeric material having: (a) an index of refraction (n) in a range from 1.2 to 2.0, preferably in the range from 1.26 to 1.8, at a selected lithographic wavelength below 400 nm; and (b) an extinction coefficient (k) in a range from 0.04 to 0.8, preferably in the range from 0.06 to 0.59 at the selected lithographic wavelength below 400 nm.

8 Claims, 7 Drawing Sheets

ATTENUATING PHASE SHIFT PHOTOMASKS

This application is a division of Ser. No. 09/294,575, filed Apr. 20, 1999 now U.S. Pat. No. 6,096,460 which is a continuation-in-part of Ser. No. 08/797,444, filed on Feb. 10, 1997 now abandoned, which claims priority from Provisional Application Ser. No. 60/021,460, filed on Jul 3, 1996.

FIELD OF THE INVENTION

This invention relates to phase shift photomasks for use in photolithography with short wavelength (i.e., <400 nm) light. More specifically this invention relates to phase shift photomasks that attenuate and change the phase of transmitted light by 180°±10°, and odd multiples thereof, relative to light propagating the same path length in air. Such photomasks are commonly known in the art as attenuating (embedded) phase shift photomasks or half-tone phase shift photomasks.

BACKGROUND OF THE INVENTION

Conventional photomasks commonly consist of a substrate, e.g., fused silica plate, having an opaque chrome film. Photomasks are produced from these blanks by providing a desired pattern of open areas in the film. In use, light is optically projected through the open areas of the photomask onto the surface of a light sensitive substrate, such as a photoresist or photopolymer-coated semiconductor wafer. Currently, photomasks are illuminated with visible or ultraviolet light. A fundamental limitation of optical imaging is that line widths of the order of the wavelength of the illuminating light are diffraction limited. In other words, light having a wavelength of the same order of magnitude as the desired optical image will be diffracted, and the projected image will be wider than the desired image.

The electronics industry seeks to extend optical lithography for manufacture of high density integrated circuits to critical dimensions of 0.25 μm and smaller. To achieve this objective, lithographic photomasks will need to work with short wavelength, i.e., <400 nm, light. Three wavelengths targeted for future optical lithography are 248 nm (KrF laser wavelength), 193 nm (ArF laser wavelength), and 157 nm ($F_2$ laser wavelength). A phase shift photomask enhances the patterned contrast of small circuit features by destructive optical interference of the light projected through the open areas in the film with light projected through the film on the substrate.

In this effort to extend optical lithography, a variety of phase-shifting photomasks have been developed for ultraviolet and visible light ranges. See, e.g., B. J. Lin, The Attenuating Phase-Shifting Mask, *Solid State Technology*, pp. 43–47, January, 1992. Attenuated phase-shifting ("APS") photomasks employ an absorptive, partially transmitting, phase shifter in place of the conventional opaque chromium part of the patterned film. The absolute transmission of the absorptive phase shifter is adjusted to less than about 0.25 to prevent creation of ghost lines in the image on the photoresist coated semiconducor wafer. However, not all materials can both phase shift and absorb by the desired amount. Consequently, a multilayered structure consisting of materials of differing absorptive and phase shifting properties may be required in some cases.

For example, a commercially available APS mask, commonly referred to as a "leaky chrome" type of APS, utilizes a chromium oxycarbonitride composition film having a variable, graded composition comprising a Cr—N rich composition at the substrate-film interface to a Cr—O rich composition at the film-air interface. The Cr—O rich composition also serves as an anti-reflective coating. While this APS masks provides a degree of phase shifting, a further procedure, such as reactive ion etching of the fused silica substrate, or the addition of a second material, such as spin-on-glass, as the phase shifter is necessary to achieve the desired 180° phase shift, or a odd integer multiple thereof, at the selected lithographic wavelength.

The concept of a phase shift photomask that attenuates light and changes its phase in a single film material so as to produce an attenuating embedded phase shift ("AES") photomask, is disclosed in U.S. Pat. No. 4,890,309. Known AES photomasks fall mainly into two categories: (1) Cr-based photomasks containing Cr, Cr-oxide, Cr-carbide, Cr-nitride, Cr-fluoride or combinations thereof (see, e.g., U.S. Pat. No. 5,459,002 and U.S. Pat. No. 5,415,953); and (2) $SiO_2$- or $Si_3N_4$-based photomasks, containing $SiO_2$ or $Si_3N_4$ together with a predominantly opaque material, such as MoN or $MoSi_2$. Commonly the latter materials are referred to generically as 'MoSiON'. In addition, AES photomasks comprising hydrogenated amorphous carbon layers, tantalum and its compounds with a layer of Cr metal, or one or more layers composed of a hafnium compound, are also known in the art.

Polymeric materials are known to be useful as phase shift materials in APS masks. For example, organic containing polymers deposited by spin coating are known to serve as the spin on glass phase shift material in a leaky chrome type of APS mask discussed above. These attenuating phase shift photomasks are not considered an attenuating embedded phase shifter photomasks because the polymeric material, be it a silicate based spin on glass or an organic containing polymeric material, which provides the necessary degree phase shift of the transmitted light, is a separate material from the material which predominantly determines the level of attenuation of the photomask. While these polymer containing APS masks find use in research on phase shift lithography, the disadvantages of producing phase shift photomasks using separate attenuator and phase shifter materials restricts their use in large scale commercial production. Accordingly, the AES masks of choice for commercial use are those based on vapor deposited inorganic materials, such as those described, for example, in U.S. Pat. No. 5,459,002 and U.S. Pat. No. 5,415,953 have found wide spread use.

U.S. Pat. No. 5,726,247 discloses a fluoropolymer nonocomposite material.

SUMMARY OF THE INVENTION

The present invention provides a polymeric transmissive attenuated embedded phase shifter photomask comprising at least one polymeric material having;

(a) an index of refraction (n) in a range from 1.2 to 2.0, preferably in the range from 1.26 to 1.8, at a selected lithographic wavelength below 400 nm; and (b) an extinction coefficient (k) in a range from 0.04 to 0.8, preferably in the range from 0.06 to 0.59 at the selected lithographic wavelength below 400 nm.

Preferred polymeric materials include amorphous fluoropolymers, particularly terpolymers of tetrafluoroethylene, dioxole and chlorotrifluoro-ethylene, said amorphous fluoropolymers most preferably doped with a chromophore, such as a fluorine functionalized organosilane, and organosilicates, or combinations thereof.

DETAILED DESCRIPTION OF THE PREFERRED EMBODIMENTS

Figure 1:
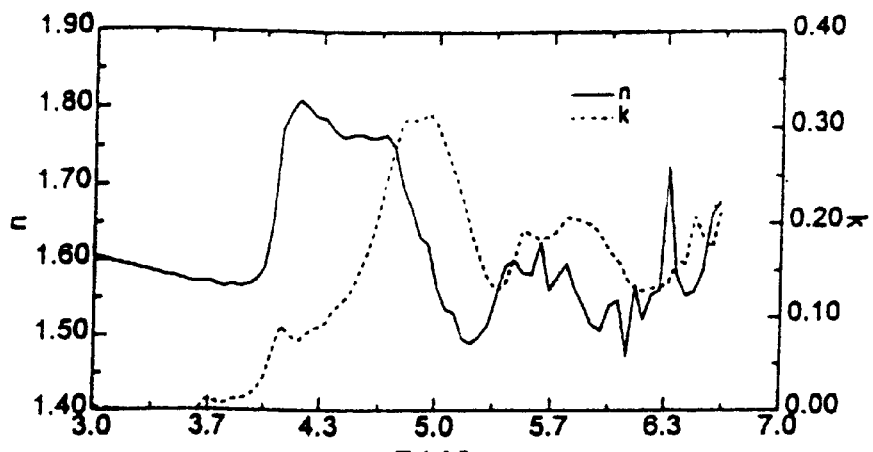
FIG. 1 is a graph showing the index of refraction "n" (solid line) and extinction coefficient "k" (broken line) of phenanthrylsilicate as a function of energy (E).

Suitable AES photomasks of this invention will have transmissions (at the selected lithographic wavelength below 400 nm) in the range from 0.005 transmission to 0.25 transmission (on an absolute transmission basis). The preferred transmission range is from 0.02 to 0.14 transmission at a selected lithographic wavelength below 400 nm. As used herein, the term "phase shift" means a phase shift of 180°±10° or odd multiples thereof.

A particular advantage of this invention lies in enabling the production of optically tunable polymeric materials which have the correct optical constants to balance the attenuation of the material, represented by the material's extinction coefficient, and the phase shifting ability of the material, represented by its index of refraction.

Polymeric Material Target Optical Properties

The first step in practicing this invention, involves demonstrating the optical performance of transmissive attenuating embedded phase shifter photomasks for use at wavelengths below 400 nm, such as for example, 193 nm (approximately 6.45 eV) and 248 nm (approximately 5 eV), so as to define the polymeric materials target optical constants. This will produce a series of figures where the transmissive attenuating embedded phase shifter photomask materials design criteria will be given. These will define, for a given index of refraction at the lithographic wavelength, what the polymeric material's extinction coefficient and the AES photomasks film thickness must be. These AES photomask designs and design criteria can then be developed.

The optical properties (index of refraction, "n" and extinction coefficient, "k") are determined from variable angle spectroscopic ellipsometry at three incident angles from 186–800 nm, corresponding to an energy range of 1.5–6.65 eV, in combination with optical reflection and transmission data. Optical constants were fit to these data simultaneously, using an optical model of the film that allowed for less dense (50%) interfacial layers at the substrate and the top surface of the film. From knowledge of the spectral dependence of optical properties, the film thickness corresponding to 180° phase shift, optical transmissivity, and reflectivity can be calculated. See generally, O. S. Heavens, *Optical Properties of Thin Solid Films*, pp 55–62, Dover, N.Y., 1991, incorporated herein by reference.

Using these methods one can select the polymeric materials having the optical properties necessary to produce transmissive attenuating embedded phase shifter photomasks in accordance with this invention with both the desired transmission and phase shift. Specific polymeric material target optical constants developed for transmissive attenuating embedded phase shifter photomasks at 248 nm and 193 nm lithographic wavelengths are discussed hereinbelow. At other lithographic wavelengths below 400 nm, such as 157 nm, these materials will have different optical constants. However, a polymeric material, once it is designed to fall into the target ranges of optical constants as discussed herein, can be used to produce transmissive attenuating embedded phase shifter photomasks of this invention at the desired lithographic wavelength below 400 nm.

Figure 2:
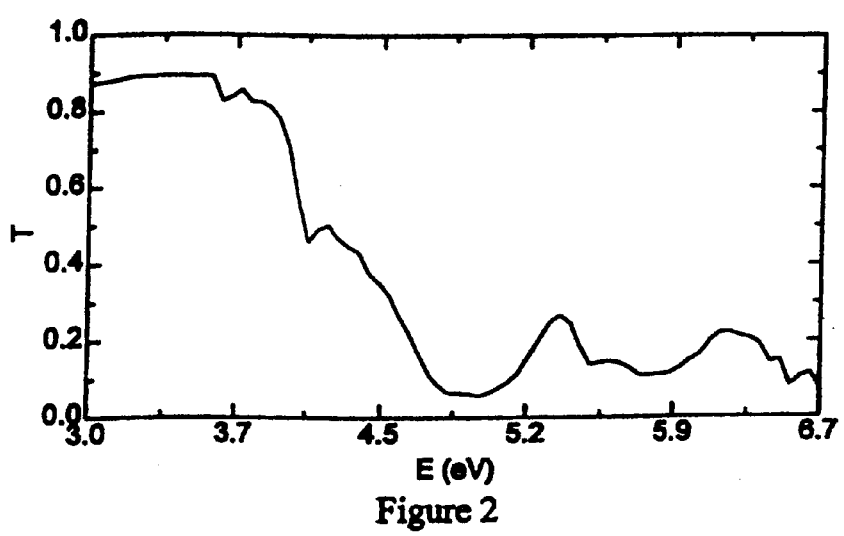
FIG. 2 is a graph illustrating the spectral transmission (T) as a function of energy (E) for an AES photomask mateial of this invention for use at a lithographic wavelength of 193 nm.
Figure 3:
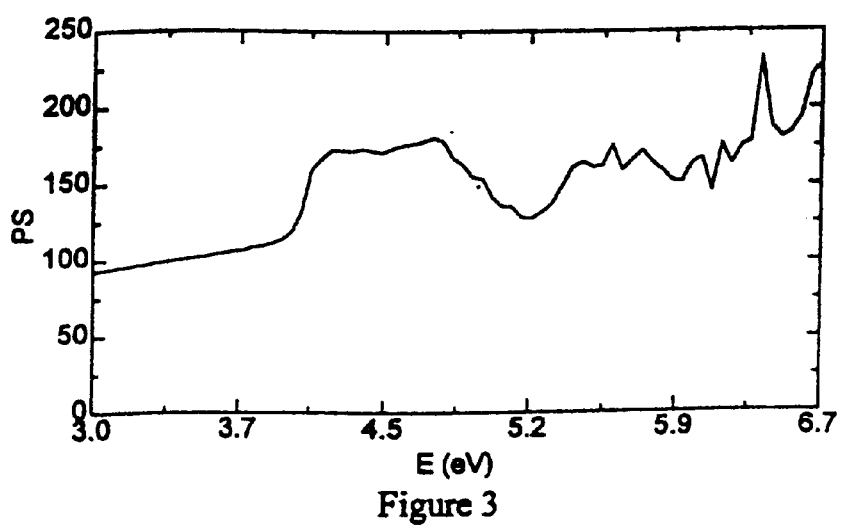
FIG. 3 is a graph illustrating the spectral phase shift (PS) as a function of energy (E) for an AES photomask material of this invention for use at a lithographic wavelength of 193 nm.
Figure 4:
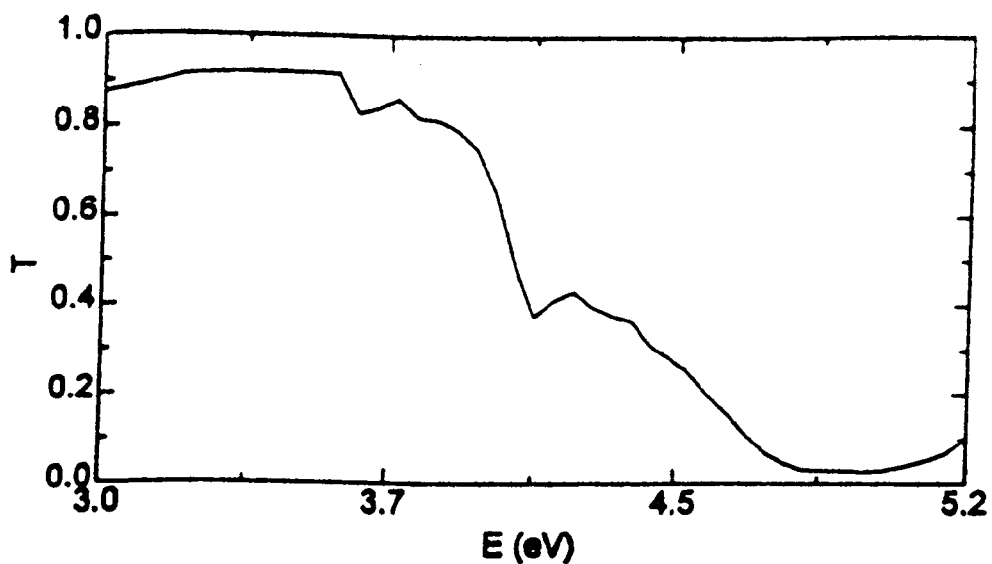
FIG. 4 is a graph illustrating the spectral transmission (T) as a function of energy (E) for an AES photomask material of this invention for use at a lithographic wavelength of 248 nm.
Figure 5:
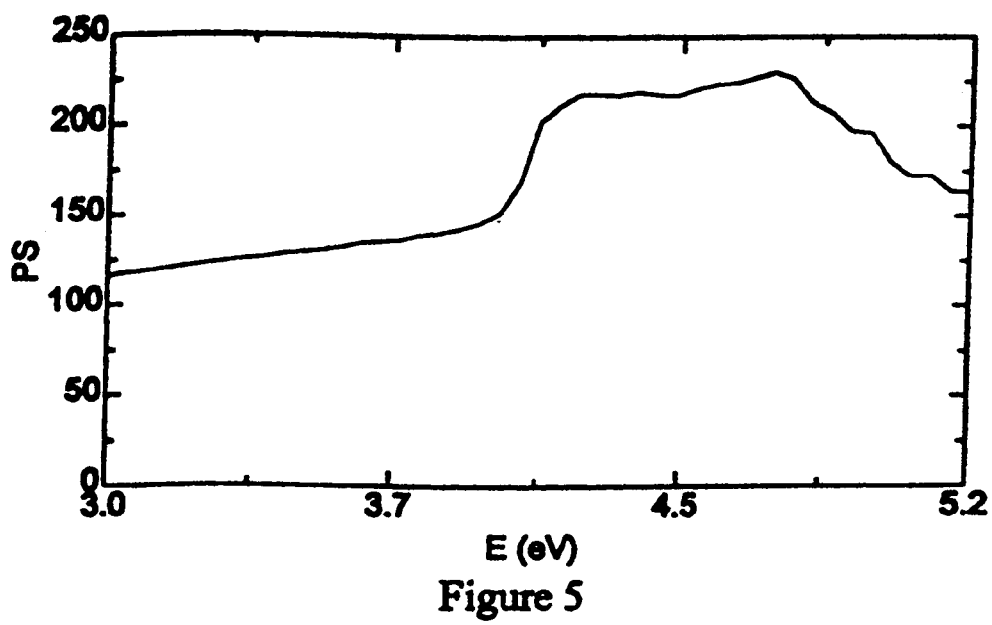
FIG. 5 is a graph illustrating the spectral phase shift (PS) as a function of energy (E) for an AES photomask material of this invention for use at a lithographic wavelength of 248 nm.

As an example, consider the performance of a given polymeric material, phenanthrylsilicate (discussed in greater detail in Example 4 below) designed as a AES photomask for use at, in one case, a lithographic wavelength of 193 nm, and in the other case a lithographic wavelength of 248 nm. The spectral optical constants of this material are shown in FIG. 1 and have optical property values at these two design wavelengths of n+ik (193 nm)=1.553+i 0.157 and n+ik (248 nm)=1.565+i 0.302. Given these values, an AES photomask for use at a 193 nm lithographic wavelength can be designed with a film thickness of 174.5 nm. The spectral transmission of this AES photomask at 193 nm is 0.15 and its phase shift at 193 nm is 180°, as seen in FIG. 2 and FIG. 3, respectively. This same polymeric material can be used to produce an AES photomask for use at 248 nm by using a AES film thickness of 221.5 nm and it will have a transmission of 0.031 and a phase shift of 180° at the 248 nm lithographic wavelength, as shown in FIGS. 4 and 5.

Figure 6:
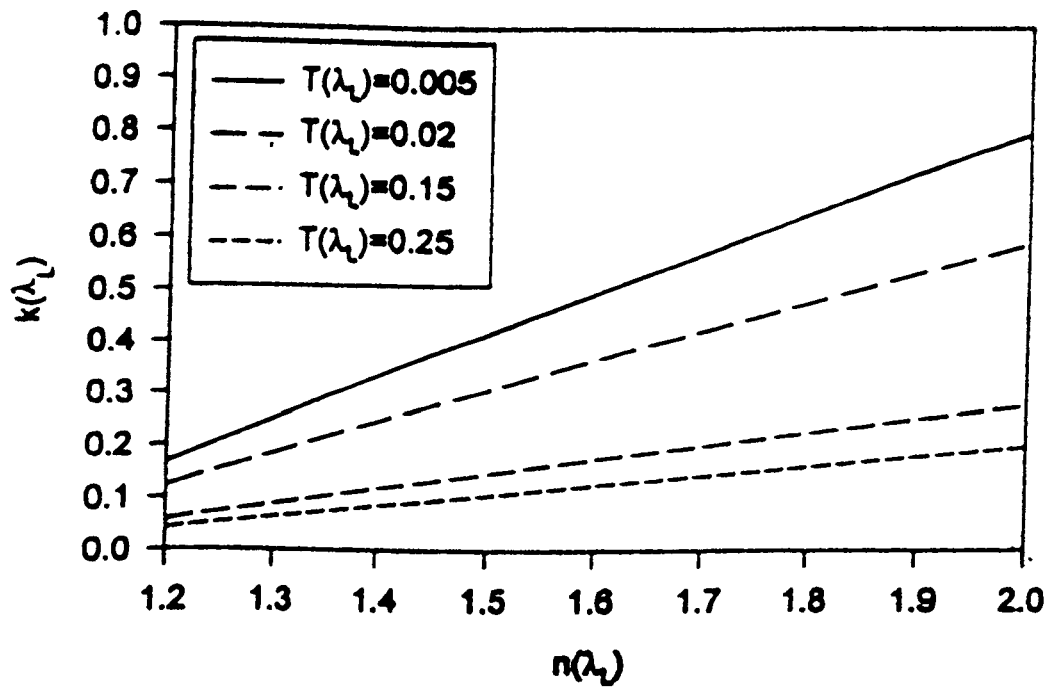
FIG. 6 is a graph illustrating the relationship between index of refraction (n) and extinction coefficient (k) of the polymeric materials suitable for use in the AES photomasks of this invention with a spectral transmission (T) in the range from 0.005 transmission to 0.25 transmission (on an absolute transmission basis) at a lithographic wavelength (L) below 400 nm.

From this data, one can determine the required polymeric materials optical properties required to produce transmissive attenuated embedded phase shifter photomask having an absolute transmission in the range from 0.005 to 0.25 transmission or in the preferred transmission range of 0.02 to 0.14 transmission at the selected lithographic wavelength below 400 nm. With reference to FIG. 6, the values of the index of refraction (n) and the extinction coefficient (k) are shown for attenuating embedded phase shifter photomask for various transmission levels. Within these ranges, a relationship between the polymers index of refraction at the selected lithographic wavelength and the necessary extinction coefficient of the polymer to achieve a desired AES photomask transmission. Therefore, the selected polymeric materials to produce the AES photomasks will lie within the range of n+ik between $T(\lambda_L)=0.005$ to $T(\lambda_L)=0.25$ or preferably in the range of n+ik between $T(\lambda_L)=0.02$ and $T(\lambda_L)=0.15$.

Phase Shift Film Thickness and Photomask Pattern Formation

Figure 7:
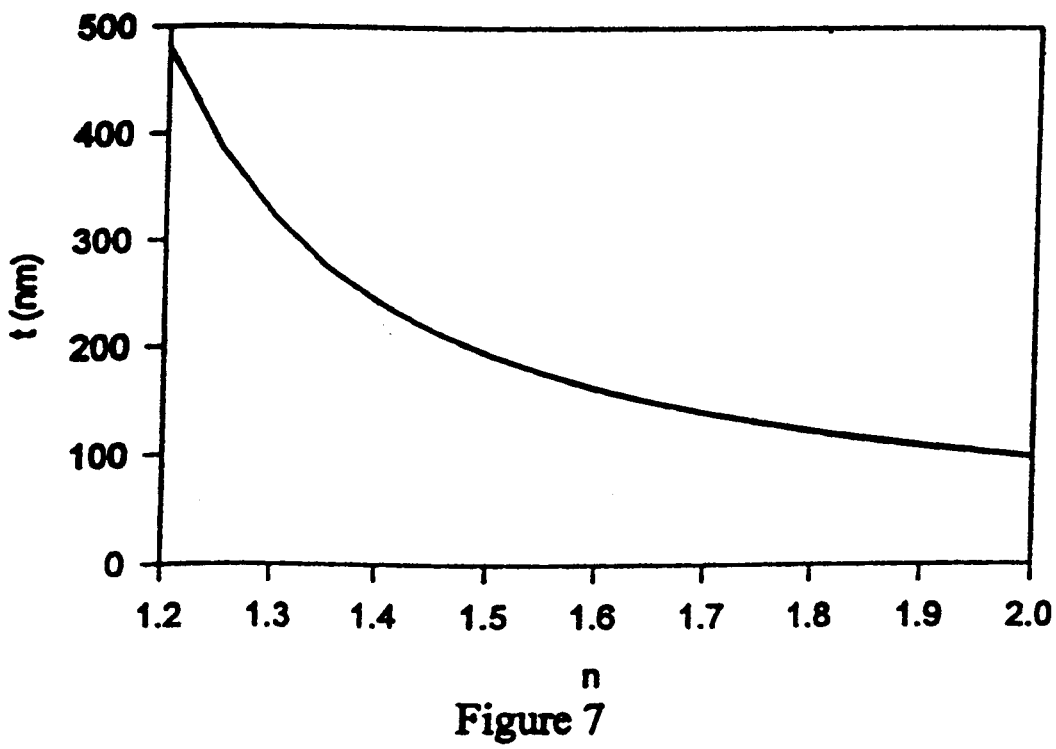
FIG. 7 is a graph illustrating the relationship between film thickness (t) and index of refraction (n) of an AES photomask material of the invention to achieve the target transmission and phase shift at a lithographic wavelength of 193 nm.
Figure 8:
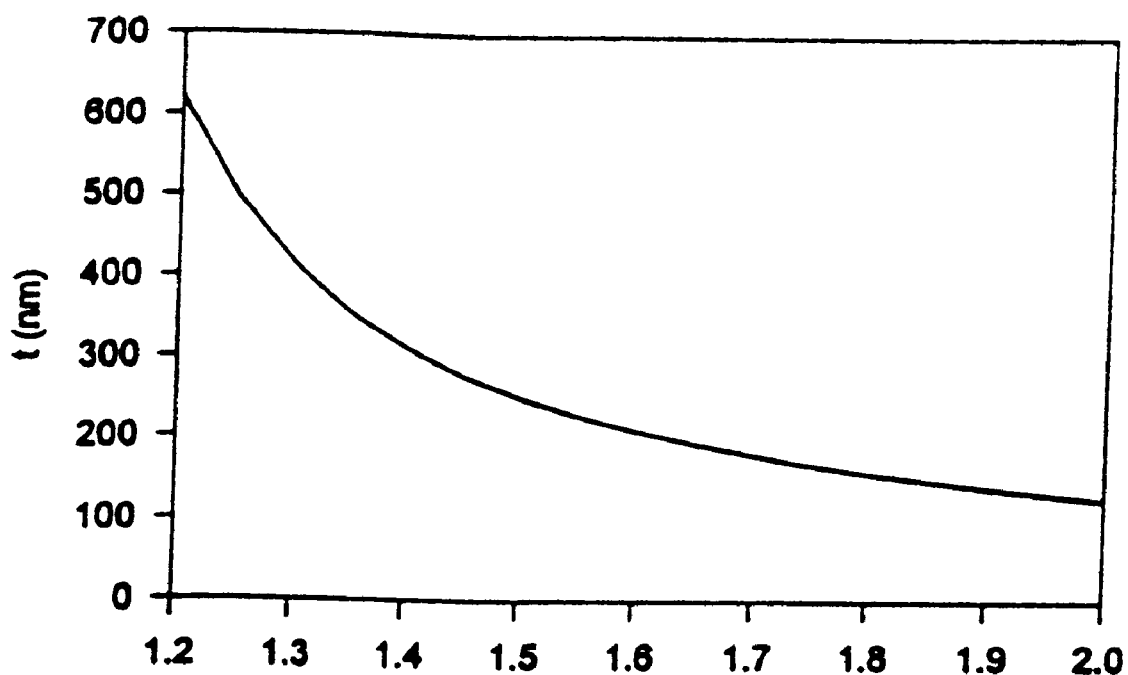
FIG. 8 is a graph illustrating the relationship between film thickness (t) and index of refraction (n) of an AES photomask material of the invention to achieve the target transmission and phase shift at a lithographic wavelength of 248 mn.

Once a polymeric material with the specified optical properties has been selected then the necessary thickness of the AES photoshift film can be calculated for the selected lithographic wavelength. Typically the AES phase shift film thickness will vary with the selected lithographic wavelength, as shown in FIG. 7, for a selected lithographic wavelength of 193 nm, and in FIG. 8 for a selected lithographic wavelength of 248 nm.

Once the appropriate polymeric material has been has been produced as a film of the necessary thickness on the quartz substrate, then the necessary pattern of open areas in the film is introduced using standard methods in the art. These would typically include applying a hard masking layer, such as Cr, to the APS film, then applying either an e-beam or an optical photoresist on top of the hard masking material. Either an e-beam or laser based patterning tool would then be used to write the desired pattern into the photoresist. After developing the resist image, an appropriate wet etchant solution, such as 9% $Ce(NH_4)_2(NO_3)_6$/6% $HClO_4$ would be used to transfer the photoresist pattern into the hard masking layer. Now reactive ion etching, for example using $CF_4/O_2$ gas would be used to produced the desired pattern of open areas in the phase shift layer of the phase shift photomask. Finally the Cr hard masking layer is removed using the wet etchant solution. One has now produced the polymeric transmissive attenuated embedded phase shift photomask.

Preferred Polymeric Materials

The polymeric materials suitable for use in the present invention are distinguished functionally from the more common solid state inorganic shifters such as the chromium oxide/nitride family. Firstly, optical behavior in the polymeric materials general arises from isolated molecular chromophores rather than the extended solid state bands in typical inorganic materials. Therefore, absorption in polymeric materials show rather narrow wavelength-dependent maxima rather than broad extensive absorption edges seen in typical inorganic materials. Because of the narrowness of these molecular absorptions, a single chromophore is likely to exhibit very different values of the extinction coefficient at both 193 and 248 nm.

Particularly useful polymeric materials are amorphous fluoropolymers and organically modified silicates, also known as organosilicates. It is particularly desirable that the amorphous fluoropolymers and/or organosilicates chosen be soluble in liquid and suitable for spin coating. Uniform films in the desired thickness range of about 100–400 nm can be generated rapidly and with substantially less capital investment by spin-coating than by vapor deposition.

Amorphous Fluoropolymers

One class of polymeric materials useful in the practice of this invention are amorphous fluoropolymers having an index of refraction (at the selected lithographic wavelength) in a range from 1.2 to 2.0, preferably in the range from 1.26 to 1.8 and an extinction coefficient (at the selected lithographic wavelength) in a range from 0.04 to 0.8, preferably in the range from 0.06 to 0.59. In general, for a given amorphous fluoropolymer to exhibit optical properties within the above ranges, the amorphous fluoropolymer should preferably contain a chromophore, such as fluorine functionalized organosilane. Specific amorphous fluoropolymers which can meet these criteria include terpolymers of tetrafluoroethylene, dioxole and chlorotrifluoroethylene. Such polymeric materials are commercially available and are commonly characterized by low dielectric constants and high resistance to a wide variety of chemical reagents.

The prototypical fluoropolymer is polytetrafluoroethylene, sold by the DuPont Company under the trademark TEFLON®. It is a highly crystalline material with no known solvents. In the late 1980's a new class of soluble fluoropolymers was developed. For example, TEFLON® AF2130, a co-polymer of tetrafluoroethylene and perfluoro(2,3-dimethyl-1,3-dioxole) is amorphous and soluble in a variety of completely fluorinated solvents. See e.g., P. R. Resnick, "The Preparation and Properties of a New Family of Amorphous Fluoropolymers: TEFLON® AF", *Mater. Res. Soc. Symp. Proc.*, Vol. 167, pages 105–10 (1990).

One of the remarkable characteristics of TEFLON® AF is its extraordinary transparency in the visible and UV. Although far too transparent for AES (by a factor of 500) as a pure material, TEFLON® AF could be used as a transparent matrix into which a suitable chromophore could be added. Such a material combination could exist as isolated molecules in a continuous fluoropolymer phase or, preferable as an interpenetrating system in which the chromophore itself is a polymeric material which also forms a continuous phase. Interpenetrating polymers (IPNs), in which each phase threads through the other, are well known in polymer science. See e.g., "Interpenetrating Polymer Networks", *American Chem. Soc. Advances in Chemistry* series, v. 239, D. Klempner, L. Sperlin and L. Utracki, eds., American Chem. Soc., Washington, D. C. (1994). An IPN would have the potential advantages of improving the normally poor adhesion of the fluoropolymer to silica and of lessening the tendency of gross phase separation of the chromophore from the fluoropolymer. Phase separation in the AES would likely give rise to an unacceptable amount of light scattering.

There have been a number of chemical difficulties associated with producing fluoropolymer-based AES. Perfluoro liquids are very poor solvents for molecules or polymers which do not contain substantial amounts of fluorine. Yet completely or substantially fluorinated materials normally show very small levels of absorption in the UV and are therefore unsuitable as AES photomasks. In accordance with this invention, this problem was solved by incorporating a fluoroalkyl phenylsilane into the TEFLON® AF both on a molecular and polymeric basis.

Organosilicates

Another class of useful polymeric materials are organosilicates having an index of refraction (at the selected lithographic wavelength) in a range from 1.2 to 2.0, preferably in the range from 1.26 to 1.8 and an extinction coefficient (at the selected lithographic wavelength) in a range from 0.04 to 0.8, preferably in the range from 0.06 to 0.59. These organosilicates can be used alone or in combination with the amorphous fluoropolymers discussed above.

Solution-based silane precursors for glassy coatings are well known from the spin-on-glass and sol-gel types of materials. The silanes may contain four alkoxy groups which are removed by hydrolysis, leaving Si-OH groups available for network formation. Alternatively, they may contain three such alkoxy groups and one permanent (directly attached) organic group. Idealized chemical reactions for the two cases are shown below.

Inorganic silicates

Equation 1   $n\ Si(OR)_4 + 4n\ H_2O \rightarrow n\ Si(OH)_4 + 4n\ ROH$
Equation 2   $n\ Si(OH)_4 \rightarrow n\ SiO_2 + 2n\ H_2O$
$R = CH_3, C_2H_5$, etc.

Organic silicates

Equation 3   $n\ R'Si(OR)_3 + 3n\ H_2O \rightarrow n\ R'Si(OH)_3 + 3n\ ROH$
Equation 4   $n\ R'Si(OH)_3 \rightarrow n\ R'SiO_{1.5} + 1.5n\ H_2O$
$R' = CH_3, C_2H_5$, phenyl, phenanthryl, etc.

The condensed network product for the organic silicate path, with empirical formula $R'SiO_{1.5}$ is also known as a silsesquioxane. These are often soluble materials and can be spin coated to give transparent films. They have excellent thermal stability and adhesion to silica. Organosilicate materials and their preparation have been recently reviewed by R. Baney, M. Itoh, A. Sakakibara and T. Suzuki, *Chem. Rev.* 95, 1409 (1995).

Organosilicates containing aromatic groups (i.e., derived from benzene and phenanthrene) which have very strong UV absorption are preferred. Since these chromophores have higher than desired extinction coefficients, they must be diluted by either the purely inorganic silicates (e.g., from $Si(OCH_3)_4$) or by other organic silicates in which the R' group is non- or weakly absorbing at the selected lithographic wavelength. Methyl and other simple saturated alkyl groups are suitably non-absorbing. An optically suitable organosilicate diluent molecule would then be $CH_3Si(OCH_3)_3$. Despite the strong absorption of the phenyl ($C_6H_5$) group at 193, it is too weakly absorbing at 248 nm to be of use in an AES photomask. However, an organosilicate based on the aromatic system phenanthrene absorbs strongly at both 193 and 248 nm.

With respect to chromophores, it is well known that simple aromatic molecules such as benzene, or more complex aromatic molecules containing several aromatic rings linked or fused together, such as naphthalene, anthracene or phenanthrene, are all strong absorbers of ultraviolet radiation. These types of structures generally retain their optical properties when incorporated into other molecular systems such as aromatic silicates, which are useful in the practice of this invention. It is also possible to modify optical properties to some extent with certain functional groups such as nitro, especially when such groups are strongly electron donating or withdrawing or are conjugated with the aromatic ring. The effect of linking together several rings, as in phenanthrene, is to extend the UV absorption to longer wavelengths. With AES materials, the very strong absorption of benzene, i.e., the phenyl group, at 193 nm can be extended to 248 nm in phenanthrene.

EXAMPLES

The nomenclature used in the following examples is summarized in Table 1.

TABLE 1

| | Nomenclature |
|---|---|
| FAPS | 4-perfluorooctylphenyl(trimethoxy) silane |
| TEFLON ® AF2130 | copolymer of chlorotrifluoroethylene - perfluoro(2,3-dimethyl) 1,3-dioxole |
| FEH | Trifluoroethanol |
| PhenanSi | 9-phenanthryl(trimethoxy)silane |
| TEOS | Tetraethoxysilane |
| diglyme | 2-methoxyethyl ether |
| THF | Tetrahydrofuran |

Example 1

An amorphous fluoropolymer, TEFLON® AF2130, was synthesized by free radical co-polymerization of chlorotrifluoroethylene and perfluoro(2,3-dimethyl) 1,3-dioxole in the approximate weight ratios of 85/15. The TEFLON® AF2130 polymer was dissolved in a fluorocarbon liquid solvent to give a 6.1% by wt. solution. 100 mg pure FAPS (synthesized as described in U.S. Pat. No. 5,180,845) was then added to the fluoropolymer solution with stirring. The combined solution was then used to spin coat a film on a fused silica substrate at a spin rate of 2000 rpm, with a duration of two minutes. The film was then dried in air for 10 minutes at 100° C. to evaporate residual solvent. The film thickness was determined to be 986 nm by ellipsometry.

Figure 9:
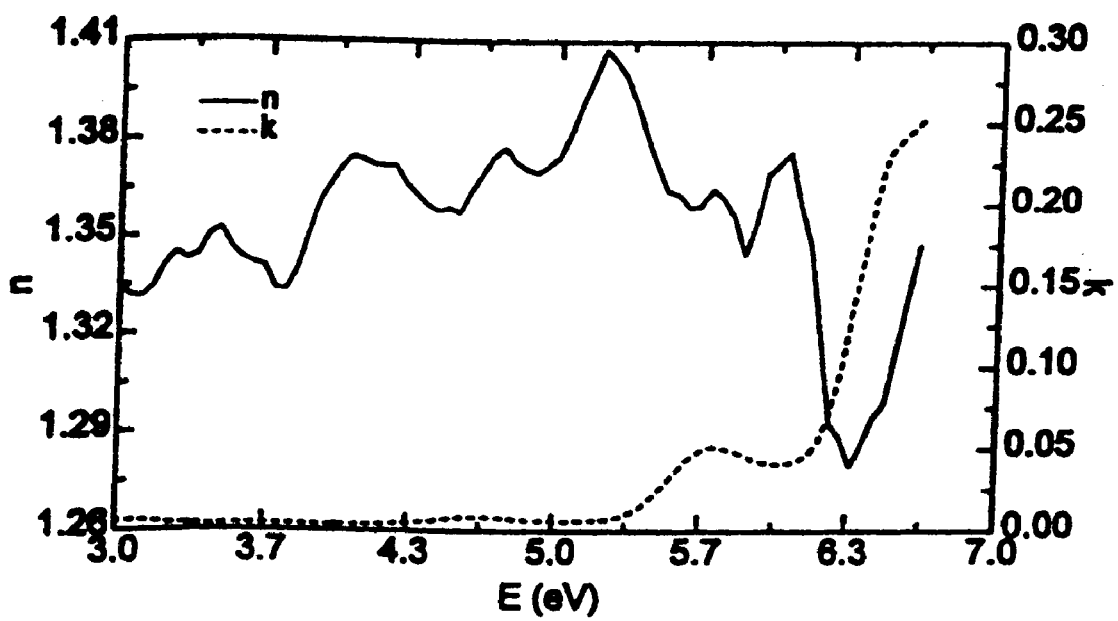
FIG. 9 is a graph showing the index of refraction "n" (solid line) and extinction coefficient "k" (broken line) of TEFLON® AF2130/4-perfluorooctyl-phenyl-(trimethoxy) silane as a function of energy (E).

Optical properties of the resulting film were determined. As seen from the spectral optical constants in FIG. 9, this FAPS/TEFLON® AF2130 polymer has optical constants which fall into the preferred range to produce AES photomasks for use at 193 nm. In Table 2, the values of the optical constants of the FAPS/TEFLON® AF2130 polymer are compared to the optical constants of a TEFLON® AF2130 polymer and it is seen that TEFLON® AF2130 does not fall into the range or the preferred range of optical constants to produce AES photomasks for use at either 248 nm or 193 nm. This FAPS/TEFLON® AF2130 polymer will produce an AES photomask for use at a selected lithographic wavelength of 193 nm with a transmission T(193 nm) =1.3% and a phase shift of 180° when the AES photomask film thickness is chosen to be 327 nm. The relative ratios of FAPS to TEFLON® AF2130 can be varied to tune the optical constants in the AES photomasks ranges so as to produce AES photomasks with varying transmissions and 180° phase shift.

TABLE 2

| | Optical Constants | |
|---|---|---|
| Material | n + ik (193 nm) | n + ik (248 nm) |
| TEFLON ® AF2130 | 1.37 + i 0.004 | 1.35 + i 0.0006 |
| TEFLON ® AF/FAPS | 1.294 + I 0.20 | 1.335 + i 0.006 |

Example 2

A fused silica slide was spin coated at the speed of 1000 rpm for two minutes with a solution of 1.7% FAPS polysilicate and 2.9% TEFLON® AF2130 in FC40 (a fluorocarbon solvent sold by 3M). The film was heated in air to 280° C. for 30 minutes to remove the solvent and density the polysilicate network. The thickness of the coating was determined by surface profilometry to be 102 nm. The FAPS polysilicate was prepared by dissolving 109 mg of FAPS in 650 gm trifluoroethanol (FEH). Then 100 mg of a 10% by weight solution of de-ionized water in FEH was added. An opaque suspension resulted. 695 mg FC-40 was then added and the suspension vigorously shaken. The suspension became translucent. An additional 153 mg of the 10% water in FEH solution was added, then all volatile materials were removed in a vacuum oven at 100° C. A clear solid glass remained in the bottom of the container. The polysilicate glass readily dissolved in 3 g of FC40 at 75° C.

Figure 10:
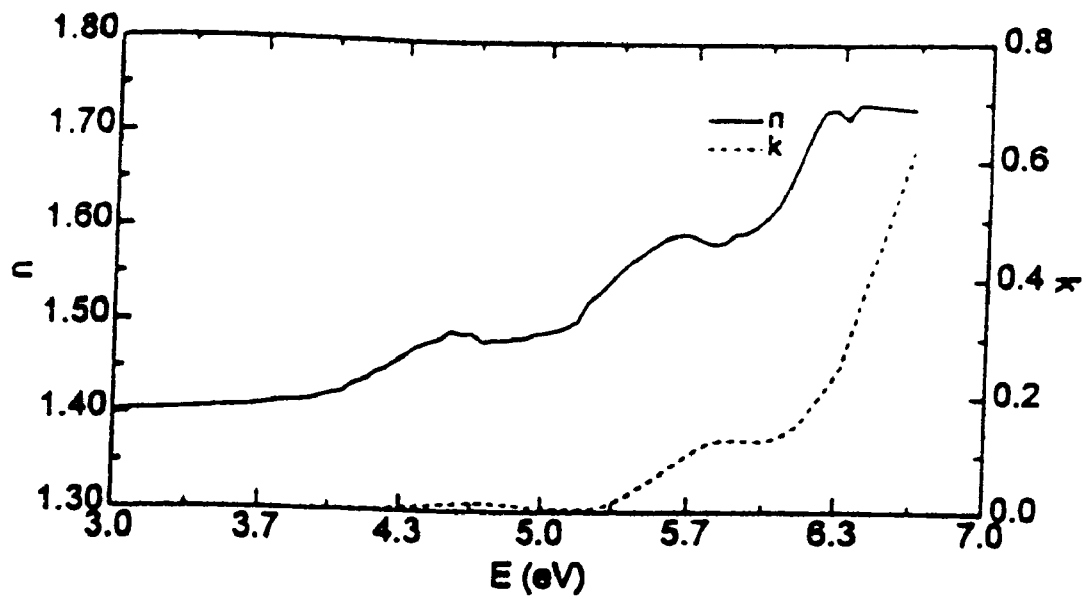
FIG. 10 is a graph showing the index of refraction "n" (solid line) and extinction coefficient "k" (broken line) of TEFLON® AF2130/4-perfluorooctyl-phenyl-(trimethoxy) silane polysilicate interpenetrating polymers as a function of energy (E).

Optical properties of the resulting film were determined. As seen from the spectral optical constants in FIG. 10, this FAPS polysilicate/TEFLON® AF2130 polymer has optical constants which fall into the preferred range to produce AES photomasks for use at 193 nm. In Table 3, the values of the optical constants of this FAPS polysilicate/TEFLON® AF2130 combination are compared to the optical constants of a TEFLON® AF2130 polymer. This FAPS polysilicate/TEFLON® AF2130 polymer will produce an AES photomask for use as a selected lithographic wavelength of 193 nm with a transmission T(193 nm) =3.3% and a phase shift of 180° when the AES photomask film thickness is chosen to be 132 nm. The relative ratios of FAPS polysilicate to TEFLON® AF2130 can be varied to tune the optical constants in the AES photomasks ranges so as to produce AES photomasks with varying transmissions and 180° phase shift.

TABLE 3

| | Optical Constants | |
|---|---|---|
| Material | n + ik (193 nm) | n + ik (248 nm) |
| TEFLON ® AF2130 | 1.35 + i 0.004 | 1.35 + i 0.0006 |
| TEFLON ® AF2130/FAPS Polysilicate IPN | 1.73 + i 0.38 | 1.49 + i 0.007 |

Example 3

1.738 g of 0.1N HCl in 2.054 g of isopropyl alcohol was added to a solution of 4.821 g of TEOS and 0.254 g of phenyltrimethoxysilane [$C_6H_5Si(OMe)_3$] in 2.051 g of isopropyl alcohol. Wt. % solids is 14.25. The molar ratio of water to the combined silanes was 3.95. The combined solution was stirred at room temperature overnight. 3.978 g of diglyme was then added and the more volatile components removed on a vacuum line. The concentrated solution was in the form of a thick clear oil. A 29.4% solution of this concentrate in diglyme was prepared and used for spin coating. The coating was generated at 1000 rpm for 2 minutes and heated at 100° C. for 10 minutes. Measured thickness by surface profilometry was 298 nm.

Figure 11:
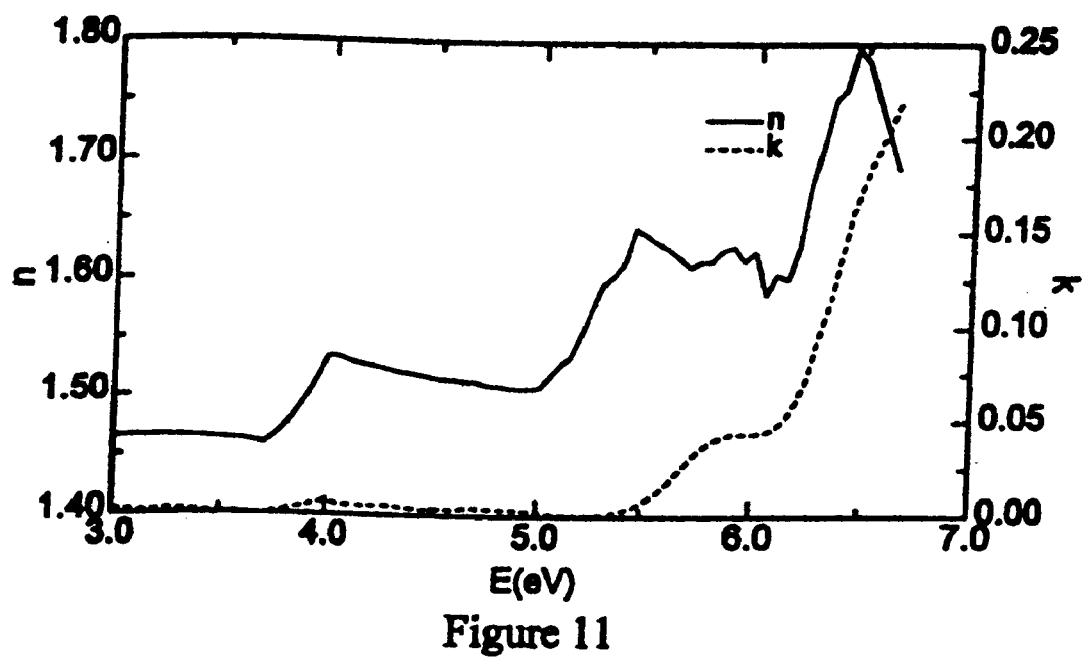
FIG. 11 is a graph illustrating the index of refraction "n" (solid line) and extinction coefficient "k" (broken line) of 5% phenylsilicate as a function of energy (E).

In addition to the fluoropolymers, organosilicates can be used to produce AES photomasks. As seen from the spectral optical constants in FIG. 11, this 5% phenyl silicate polymer has optical constants which fall into the preferred range to produce AES photomasks for use at 193 nm. In Table 4, the values of the optical constants for 100% phenyl silicate polymer and 5% phenyl silicate polymer are compared to the optical constants of a pure silica. It is seen from that data that pure silica does not fall into the range of optical constants to produce AES photomasks for use at either 248 nm or 193 nm. In addition it can be seen that pure phenyl silicate is too strongly absorbing and also does not fall into the acceptable range. The 5% phenyl silicate polymer will produce an AES photomask for use as a selected lithographic wavelength of 193 nm with a transmission T(193 nm) =23.9% and a phase shift of 180° when the AES photomask film thickness is chosen to be 123 nm. The phenyl content of the organosilicate can be varied to tune the optical constants in the AES photomasks ranges so as to produce AES photomasks with varying transmissions and 180° phase shift.

TABLE 4

| | Optical Constants | |
|---|---|---|
| Material | n + ik (193 nm) | n + ik (248 nm) |
| 100% Phenyl Silicate | 1.940 + i 1.340 | 1.700 + i 0.008 |
| 5% Phenyl Silicate | 1.78 + i 0.16 | 1.78 + i 0.002 |
| Pure Silica | 1.5395 + i0.0000 | 1.5395 + 0.0000 |

Figure 12:
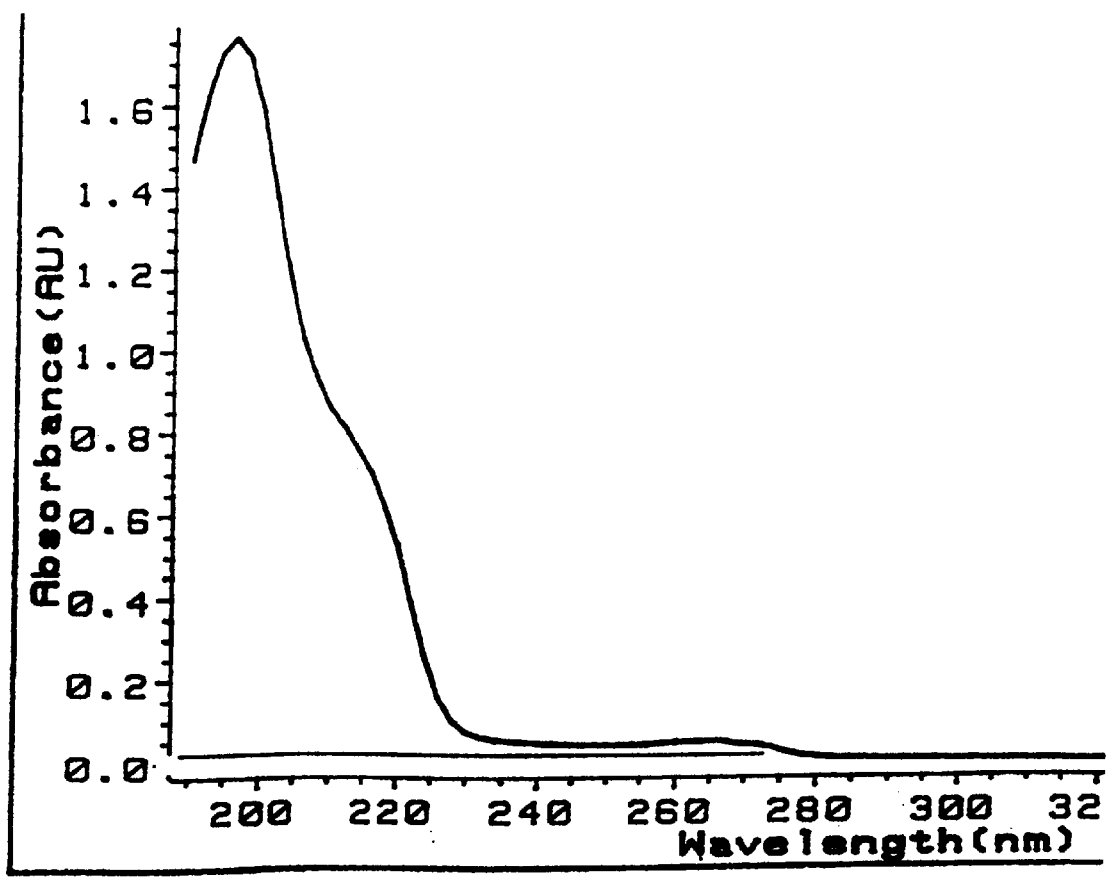
FIG. 12 is a UV absorption spectrum of a 1000 Å phenylsilicate film before and after reactive ion etching.

Another desirable property of these organosilicates in comparison to other silicates is their ability to be reactive ion etched (RIE) with good selectivity, or differential etchability, relative to the fused quartz substrate. This can be seen from the results of a phenyl silicate film on a fused quartz substrate which was exposed to an oxygen/fluorine plasma generated from $CF_4/O_2$ at 13.56 MHz. A five minute exposure of the film on a partially masked fused quartz substrate completely removed the organic silicate as can be seen in FIG. 12 from the UV absorption spectra of the sample before and after RIE exposure without etching the fused quartz substrate. The surface roughness of the substrate was assessed by a surface profilometer. No significant difference before and after the RIE treatment was apparent.

Example 4

The compound PhenanSi was synthesized from the reaction of magnesium with 9-bromophenanthrene followed by reaction of the resultant phenanthryl magnesium bromide with tetramethoxysilane as follows.

10.27 g (0.040 mole) of 9-bromophenanthrene dissolved in 40 ml of THF was added over 1 hr. to 1.088 g (0.045 mole) of dried Mg turnings in 40 ml THF plus 3 drops of bromoethane with stirring at room temperature under a nitrogen blanket. The resulting brown phenanthryl MgBr solution was refluxed for 3.5 hours and stirred at room temperature overnight. The solution was then added over 45 minutes to 18.6 ml 0.126 mole) of tetramethoxysilane at room temperature. The reaction was refluxed for 5 hours and stirred at room temperature for approximately 70 hours. Volatile species were then removed under vacuum and the solid residue extracted with hexane, then filtered to isolate a hexane-soluble fraction. The hexane was then removed under vacuum. 10.35 g (86.7% yield) of a brown solid residue was isolated. The identity of the product was confirmed by proton and carbon nuclear magnetic resonance spectroscopy. 1.038 g PhenanSi and 3.34 g TEOS were dissolved in 9.07 g isopropyl alcohol. 1.108 g 0.1N HCl was then added and the solution stirred overnight. 3.47 g of this solution was then combined with 2.85 g diglyme and the more volatile components removed on a vacuum line. An additional 61.1 g diglyme was added to give a concentration useful for the desired film thickness. The solution was then filtered and used to spin coat fused silica in the manner of Example 2. The dry thickness of the film was determined by surface profilometry to be 185 nm.

Figure 13:
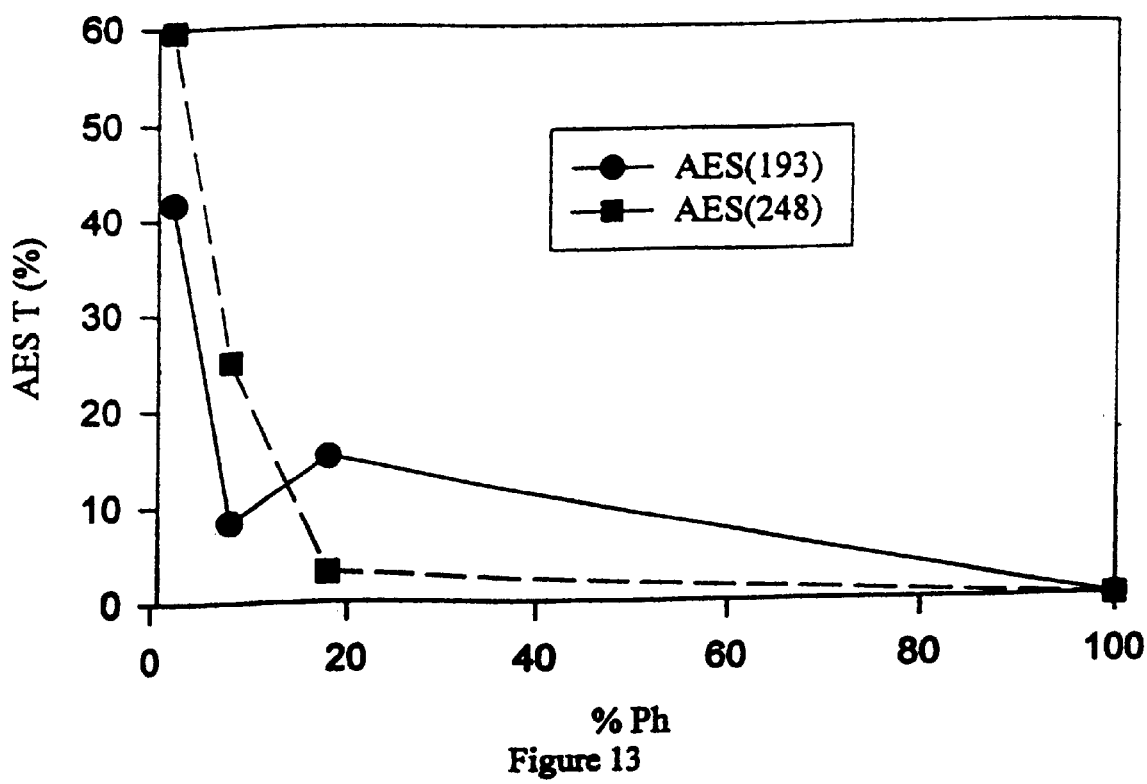
FIG. 13 is a graph illustrating the spectral transmission (% T as a function of % phenanthryl in AES photomask materials of this invention comprising phenanthrylsilicate polymer films at lithographic wavelengths of 193 nm and 248 nm.

Optical properties of the resulting film were determined. The absorption of phenyl containing polymers is much stronger at 193 nm than at 248 nm. Results are shown in FIG. 1 and reported in Table 5. Optical constants for pure silica and pure phenanthryl silicate, as comparison to the 18% phenanthryl silicate polymer of this example, are also shown in Table 5. This 18% phenanthryl silicate polymer will produce an AES photomask for use as a selected lithographic wavelength of 193 nm with a transmission T (193 nm) =15.1% and a phase shift of 180° when the AES photomask film thickness is chosen to be 174 nm and this polymer will also produce an AES photomask for use at a lithographic wavelength of 248 nm with a transmission T(248 nm) =3.1% and a phase shift of 180° when the AES photomask film thickness is chosen to be 221 nm. The relative concentration of phenanthryl silicate can be varied to tune the optical constants in the AES photomasks ranges so as to produce AES photomasks with varying transmissions and 180° phase shift. The AES photomask transmissions is shown in FIG. 13 for a series of polymers with varying phenanthryl concentration.

TABLE 5

Optical Constants

| Material | n + ik (193 nm) | n + ik (248 nm) |
|---|---|---|
| 100% Phenanthrylsilicate | 1.382 + i 0.692 | 1.364 + i 0.665 |
| 18% Phenanthrylsilicate | 1.553 + i 0.157 | 1.565 + i 0.302 |
| 8% Phenanthrylsilicate | 1.611 + i 0.124 | 1.604 + i 0.229 |
| 2.3% Phenanthrylsilicate | 1.625 + i 0.039 | 1.622 + i 0.076 |
| Pure Silica | 1.5395 + i0.0000 | 1.5395 + 0.0000 |

Example 5

623 mg phenanthrylsilicate and 163 mg phenyltrimethoxysilane were dissolved in 4.79 g TEOS. 4.11 g of 2-propanol was then added, followed by 1.73 g of 0.1N HCl. The sample was allowed to stand at room temperature for 16 hours. Then 3.98 g of diglyme was added. The most volatile components (alcohol, water and HCl) were removed from the system under a vacuum of about 1 torr ($1.33 \times 10^2$ Pa), leaving a solvent of mostly diglyme. This solution was added to a 2.3 fold excess of pure diglyme so as to give a concentration suitable for the desired film thickness. A 190 nm thick film (after drying) was then spin coated at a speed of 1000 rpm from the solution.

Figure 14:
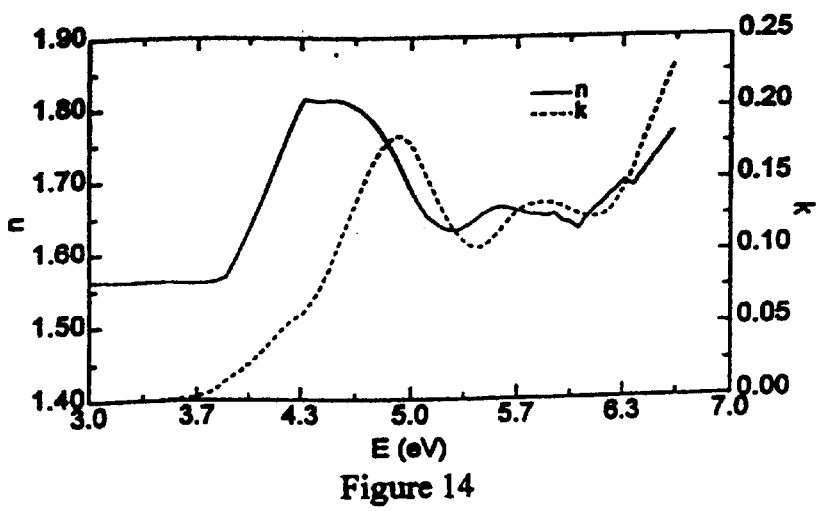
FIG. 14 is a graph illustrating the index of refraction "n" (solid line) and extinction coefficient "k" (broken line) of phenanthrylphenylsilicate as a function of energy (E).

Optical properties of the resulting film were then determined. The absorption of phenyl containing polymers is much stronger at 193 nm than at 248 nm, while phenanthryl is a good absorber at both 248 and 193 nm. Therefore it becomes possible, using the flexibility inherent in the chemistry of these polymeric materials, to produce a phenanthryl phenyl silicate for which one polymeric material can be used to produce AES photomasks with the same transmission at different lithographic wavelengths. This polymer has the advantage that one composition can be used to produce a family of embedded shifters for multiple lithographic wavelengths where only the AES photomask film thickness need to be varied for application at each lithographic wavelength. The compositional tuning of phenanthryl phenyl silicates allowed the AES photomask designer the ability to independently tune the optical constants at for examples 248 nm and 193 nm so as to arrive at identical values of n+ik at each wavelength. Then only the AES photomask film thickness is required to determine the selected lithographic wavelength. This can be seen from the spectral optical constants in FIG. 14 of the 8% phenanthryl 3% phenyl silicate polymer. Table 4, reports the optical constants of this 8% phenanthryl 3% phenyl silicate polymer and, for comparison, the optical constants of 8% phenanthryl silicate, where the optical constants at 193 nm and 248 nm are different. This 8% phenanthryl 3% phenyl silicate polymer will produce an AES photomask for use as a selected lithographic wavelength of 193 nm with a transmission T (193 nm)=17.8% and a phase shift of 180° when the AES photomask film thickness is chosen to be 181 nm and this polymer will also produce an AES photomask for use at a lithographic wavelength of 248 nm with a transmission T (248 nm)=18.9% and a phase shift of 180° when the AES photomask film thickness is chosen to be 137 nm. The relative concentration of phenanthryl and phenyl in the silicate can be varied to tune the optical constants in the AES photomasks ranges so as to produce AES photomasks with varying transmissions and 180° phase shift while still producing comparable optical properties and AES photomask transmissions at both 193 nm and 248 nm lithographic wavelengths.

TABLE 6

Optical Constants

| Material | n + ik (193 nm) | n + ik (248 nm) |
|---|---|---|
| 8% Phenanthryl 3% Phenylsilicate | 1.705 + i 0.171 | 1.687 + i 0.175 |
| 8% Phenanthrylsilicate | 1.611 + i 0.124 | 1.604 + i 0.229 |

What is claimed is:

1. A polymeric transmissive attenuated embedded phase shifter photomask comprising at least one polymeric material having;
   (a) an index of refraction (n) in a range from 1.2 to 2.0 at a selected lithographic wavelength below 400 nm; and
   (b) an extinction coefficient (k) in a range from 0.04 to 0.8 at the selected lithographic wavelength below 400 nm; wherein the at least one polymeric material is selected from the group consisting of polysiloxane polymers and polysiloxane polymers doped with a chromophore.

2. The photomask of claim 1, wherein the index of refraction is in the range of from about 1.26 to 1.8 at the selected lithographic wavelength and the extinction coefficient is in the range of from about 0.06 to 0.59 at the selected lithographic wavelength.

3. The photomask of claim 1 wherein the selected lithographic wavelength is selected from the group consisting of 193 nm and 248nm.

4. The photomask of claim 1 wherein the at least one polymeric material is a polysiloxane polymer doped with a chromophore.

5. The photomask of claim 4, wherein the chromophore is selected from the group consisting of aromatic compounds.

6. The photomasks of claim 5, wherein the chromophore is selected from the group consisting of phenyl and polynuclear aromatic compounds.

7. The photomask of claim 5 wherein the chromophore is a polynuclear aromatic compound selected from the group consisting of naphthyl, anthryl and phenanthryl.

8. The photomask of claim 1 wherein the chromophore is selected from the group consisting of phenyl and phenanthryl.

* * * * *